(12) United States Patent
Hayashi et al.

(10) Patent No.: US 6,285,640 B1
(45) Date of Patent: *Sep. 4, 2001

(54) DISK REPRODUCING APPARATUS HAVING ACTIVE WIDE-RANGE PLL DEVICE

(75) Inventors: Yasuhiro Hayashi; Kouichi Mitani, both of Yokohama (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/356,355

(22) Filed: Jul. 19, 1999

Related U.S. Application Data

(63) Continuation of application No. 08/886,541, filed on Jul. 1, 1997, now Pat. No. 5,982,724.

(30) Foreign Application Priority Data

Jul. 2, 1996 (JP) .................................................. 8-189916

(51) Int. Cl.[7] ....................................................... G11B 7/00
(52) U.S. Cl. .................. 369/47.29; 369/47.3; 369/59.14; 369/59.2; 369/124.05
(58) Field of Search ............................... 369/124, 50, 48, 369/47, 54, 59, 124.05, 47.29, 47.3, 59.14, 59.2

(56) References Cited

U.S. PATENT DOCUMENTS

| | | |
|---|---|---|
| 4,280,104 | 7/1981 | Rzeszewski . |
| 4,988,955 | 1/1991 | Horie . |
| 5,019,785 | 5/1991 | Fognini . |
| 5,089,757 | 2/1992 | Wilson . |
| 5,202,906 | 4/1993 | Saito et al. . |

(List continued on next page.)

FOREIGN PATENT DOCUMENTS

| | | |
|---|---|---|
| 0 318 930 | 6/1989 | (EP) . |
| 56-137738 | 10/1981 | (JP) . |

OTHER PUBLICATIONS

Patent Abstracts of Japan, vol. 096, No. 011, Nov. 29, 1996, JP 08 185666, Jul. 16, 1996.
Patent Abstracts of Japan, vol. 015, No. 495 (P–1288), Dec. 13, 1991, JP 03 214462, Sep. 19, 1991.

*Primary Examiner*—Nabil Hindi
(74) *Attorney, Agent, or Firm*—Oblon, Spivak, McClelland, Maier & Neustadt, P.C.

(57) ABSTRACT

This invention prepares two control voltage to be input to a VCO circuit. The first control voltage is used to continuously change the oscillation frequency of the VCO circuit. The second control voltage is used to continuously change the first control voltage/oscillation frequency characteristics. The invention also includes a phase detecting circuit for comparing the phase of the data read from a disk with that of the output from the voltage-controlled oscillator, a frequency detecting circuit for comparing the frequency of the data read from the disk with that of the output from the voltage-controlled oscillator, a first filter circuit for equalizing signals representing the detection results obtained by the phase detecting circuit and the frequency detecting circuit, and a second filter circuit for extracting only a low-frequency component from the output from the first filter circuit. The output from the first filter circuit is used as the first control voltage. The output from the second filter circuit is used as the second control voltage. The second control voltage is changed to always keep the first control voltage at a predetermined voltage.

8 Claims, 7 Drawing Sheets

U.S. PATENT DOCUMENTS

| | | |
|---|---|---|
| 5,233,316 | 8/1993 | Yamada et al. . |
| 5,239,274 | 8/1993 | Chi . |
| 5,300,898 | 4/1994 | Chen et al. . |
| 5,335,365 | 8/1994 | Ballantyne et al. . |
| 5,347,232 | 9/1994 | Nishimichi . |
| 5,388,087 | 2/1995 | Saiki et al. . |
| 5,389,898 | 2/1995 | Taketoshi et al. . |
| 5,420,545 | 5/1995 | Davis et al. . |
| 5,467,331 | 11/1995 | Saiki et al. . |
| 5,528,574 | 6/1996 | Takeuchi et al. . |
| 5,577,086 | 11/1996 | Fujimoto et al. . |
| 5,600,279 * | 2/1997 | Mori ............................ 331/36 |
| 5,638,014 | 6/1997 | Kurita . |
| 5,671,201 * | 9/1997 | Yokota et al. ................ 369/50 |
| 5,694,380 * | 12/1997 | Shimizume et al. ........... 369/50 |
| 5,703,511 | 12/1997 | Okamoto . |
| 5,729,515 | 3/1998 | Inagawa et al. . |
| 5,764,609 | 6/1998 | Araki et al. . |
| 5,777,520 | 7/1998 | Kawakami . |
| 5,805,546 | 9/1998 | Ando . |

\* cited by examiner

DISK REPRODUCING APPARATUS HAVING ACTIVE WIDE-RANGE PLL DEVICE

This application is a continuation of Ser. No. 08/886,541 filed Jul. 1, 1997, U.S. Pat. No. 5,982,724.

BACKGROUND OF THE INVENTION

The present invention relates to a high-performance active wide-range PLL device used for an optical disk reproducing apparatus or the like such as a CD (Compact Disk) or CD-ROM driving system.

At present, in the field of acoustic equipment, a digital recording/reproducing system (disk reproducing apparatus) is known, which converts an audio signal into a digital signal by a PCM (Pulse Cole Modulation) technique, and recording/reproducing this signal on/ from a recording medium such as a disk or a magnetic tape so as to perform a high-density, high-fidelity recording/reproducing operation. CDs have been used most widely. A CD is a disk having a diameter of 12 cm on which bit strings corresponding to digital data are formed, and from which the bit strings are optically read. Such a disk reproducing apparatus is designed to move an optical pickup element incorporating a semiconductor laser or a photoelectric conversion element from the inner periphery side to the outer periphery side in the manner of linear tracking, and rotate a CD at a constant linear velocity (CLV) so as to read data recorded on the CD.

A CD-ROM driving system is a typical disk reproducing apparatus. The CD-ROM driving system is an apparatus for reproducing an audio signal and ROM data such as image information and a character code which are recorded together on a disk. The audio signal is reproduced at a normal reproduction speed (single speed) to output a sound. In contrast to this, the ROM data is reproduced at the double speed or higher to read the data as fast as possible. When the disk having such an audio signal and ROM data recorded together thereon is to be played, the reproduction speeds must be frequently switched (e.g., from the single speed to the double speed, and vice versa).

A CD system was originally an audio reproducing system, and hence was rotated at the single speed. However, ever since the CD system was used as a CD-ROM driving system, the drawback of this system has been the low transfer rate as compared with general computer storage media. Furthermore, in consideration of the reproduction processing of current large-capacity moving image data, it is important to increase the transfer rate. Recently, quadruple-speed reproducing apparatuses have been taken for granted, and the reproduction speed has increased from the quadruple speed to the sextuple speed and the octuple speed; there is no end to speed competition.

In general, however, the disk specifications of a CD are determined on the basis of the single speed, and constant linear velocity recording (CLV recording) is performed. For this reason, the number of revolutions of the disk differs at the inner and outer peripheries. In the single speed mode, the inner periphery of the disk rotates at 8 Hz; and the outer periphery, at 3 Hz. In the double speed mode, the inner periphery rotates at 16 Hz; and the outer periphery, at 6 Hz. In the octuple speed mode, the inner periphery rotates at 64 Hz; and the outer periphery, at 24 Hz. That is, the disk must be rotated at very high speeds. In addition, an expensive, high-performance motor with a larger torque is required for a seek operation because this number of revolutions must be corrected within a short period of time.

Recently, however, as the rotational speed of a disk has approached its limit, a driving apparatus designed to perform CAV (Constant Angular Velocity) control to rotate a disk at a constant angular velocity has been developed. In this system, the number of revolutions of the disk motor need not be changed. In the CAV system, however, the transmission rate of data varies. For example, when the disk is rotated such that the data transfer rate at the inner periphery becomes the quadruple speed, the transfer rate at the outer periphery becomes 2.5 times that at the outer periphery at the same number of revolutions. In addition, in the CAV system, a mechanical part such as an FG (Frequency Generator) serving as a circuit for generating pulses in accordance with the number of revolutions of the motor is required to rotate the motor at a constant speed. In addition, since the reproduction speed (data transfer rate) changes from the inner periphery to the outer periphery, the frequency range in which the PLL can be locked must be expanded. Furthermore, CAV control must be switched to CLV control to reproduce normal musical sounds.

As described above, in the case of CAV control, the data transfer rate at the outer periphery becomes twice or more that at the inner periphery. In addition, since data are sequentially recorded on most dicks from the inner periphery to the outer periphery, data tracks concentrate on the inner periphery side of the disk. For this reason, in the case of CAV control, the system often operates at low transfer rates, resulting in disadvantages.

If, however, data can be read by rotating a disk at a constant angular velocity (CAV), the motor required to rotate the disk need not have a very large capacity. In addition, since rotation variations need not be corrected even in a seek time, the system can operate at higher speeds. In order to realize a data read operation by rotating the disk under CAV control, the variable width of the VCO circuit in the disk driving system may be increased. When a disk on which data is recorded at a constant linear velocity is rotated at a constant angular velocity, the data rate of signals extracted from the inner periphery differs from that of signals extracted from the outer periphery by 2.5 times. That is, the transfer rate at the outer periphery is 2.5 times higher than that at the inner periphery. In order to read this data, therefore, the capture range of the VCO circuit must be expanded. In other words, the oscillation range of the VCO circuit must be expanded.

To increase the variable width of the VCO circuit is to increase the conversion gain of the VCO circuit. and the gain of the PLL. In general, as the gain of the PLL increases, the response speed of the PLL in a closed state increases to follow a slight change in input signal with time. As a result, the jitter in a sync clock CK deteriorates, and the error rate of data increases. The variable width of the VCO circuit must be increased to shorten the seek time. However, this increase is not preferable in consideration of the reliability (the error rate of data) of the CD-ROM driving system. In the normal reproduction state, a variable width of several % is sufficient for the oscillation frequency at each lock position of the PLL. Assume that the disk is rotating at a perfectly constant angular velocity. In this case, in order to absorb variations in data rate in a seek operation, very wide variable widths of −60% and +260% are respectively required when the seek operation is performed from the outer periphery to the inner periphery, and from the inner periphery to the outer periphery. For this reason, the condition for this normal reproduction mode contradicts the condition for the optimal seek time in the high-speed reproduction mode; it is very difficult to satisfy both the conditions.

BRIEF SUMMARY OF THE INVENTION

It is, therefore, an object of the present invention to provide an active wide-range PLL device, a phase lock loop method, and an optical disk reproducing apparatus using the PLL device, which can satisfy both the condition for the normal reproduction mode and the condition for the optimal seek time in the high-speed reproduction mode.

In order to achieve the above object, according to the present invention, there is provided an active wide-range PLL device comprising: a voltage-controlled oscillator which continuously changes an oscillation frequency in accordance with a first control voltage, and continuously changes first control voltage/oscillation frequency characteristics in accordance with a second control voltage; a phase detecting circuit for comparing a phase of data read from a disk with a phase of an output from the voltage-controlled oscillator; a frequency detecting circuit for comparing a frequency of the data read from the disk with a frequency of the output from the voltage-controlled oscillator; a first filter circuit for equalizing signals representing the detection results obtained by the phase detecting circuit and the frequency detecting circuit; and a second filter circuit for extracting only a low-frequency component from an output from the first filter, wherein the output from the first filter circuit is input to the first control voltage, and an output from the second filter circuit is input to the second control voltage to change the second control voltage to always keep the first control voltage at a predetermined voltage.

According to the present invention, there is provided a phase lock loop method comprising: the step of causing first filter means to equalize detection results obtained by phase detecting means and frequency detecting means, the phase detecting means comparing a phase of data read from a disk with a phase of an output from a voltage-controlled oscillator which continuously changes an oscillation frequency in accordance with a first control voltage, and continuously changes first control voltage/oscillation frequency characteristics in accordance with a second control voltage, and the frequency detecting means comparing a frequency of data from the phase detecting means with a frequency of an output from the voltage-controlled oscillator; the step of extracting only a low-frequency component from an output from the first filter means by using second filter means; and the step of inputting an output from the first filter means to the first control voltage, and inputting an output from the second filter means to the second control voltage, thereby changing the second control voltage to always keep the first control voltage at a predetermined voltage.

According to the present invention, there is provided a disk reproducing apparatus having a PLL device in which two control voltages to be input to a VCO circuit are prepared, one control voltage is input to one input voltage to perform conventional control, and the other control voltage which changes gradually to follow changes in data rate is input to the other input terminal, thereby satisfying both the conditions required for the VCO circuit in the normal reproduction mode and the seek mode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, servo to explain the principles of the invention.

DETAILED DESCRIPTION OF THE INVENTION

Figure 1:
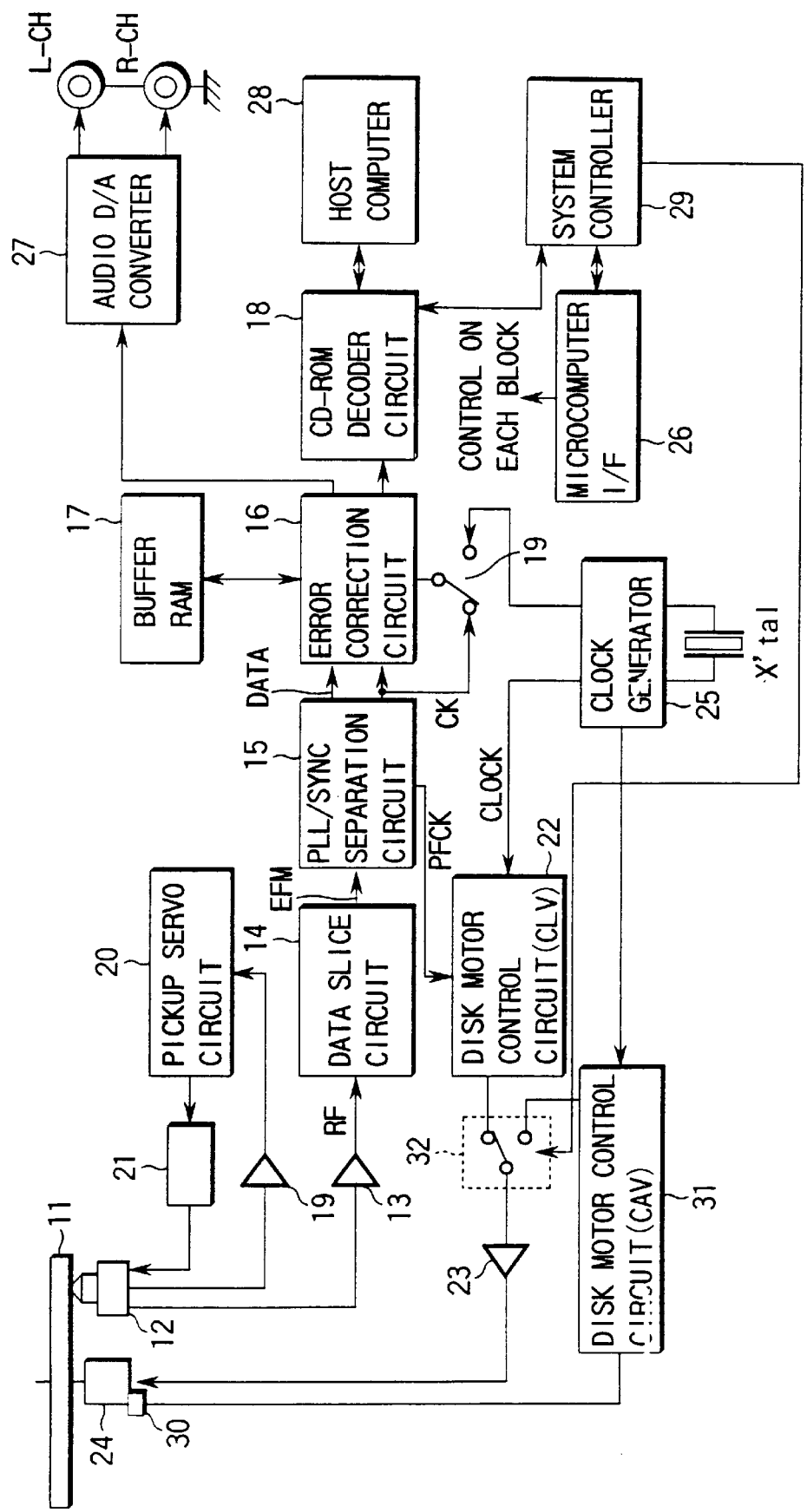
FIG. 1 is a block diagram showing the arrangement of a CD-ROM driving system of the present invention.
Figure 2:
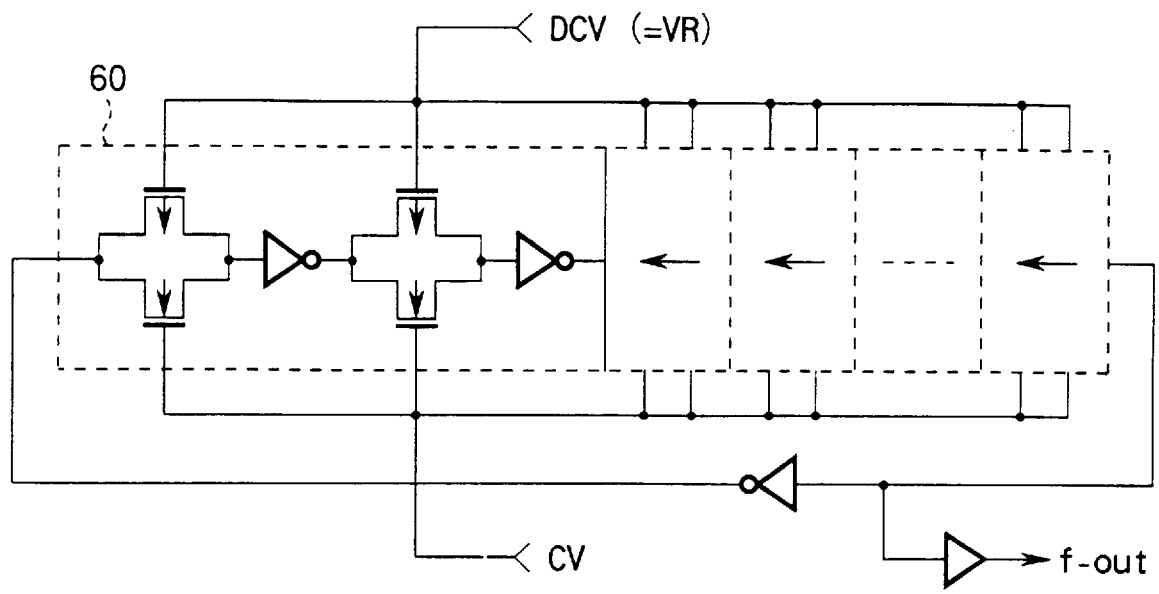
FIG. 2 is a circuit diagram showing a ring oscillator using a delay cell used in a VCO circuit in the present invention.
Figure 3:
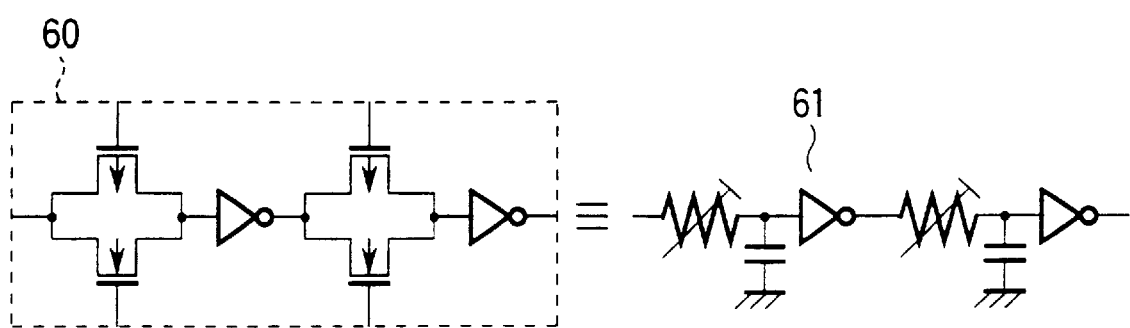
FIG. 3 is an equivalent circuit diagram of the delay cell in the present invention.
Figure 4:
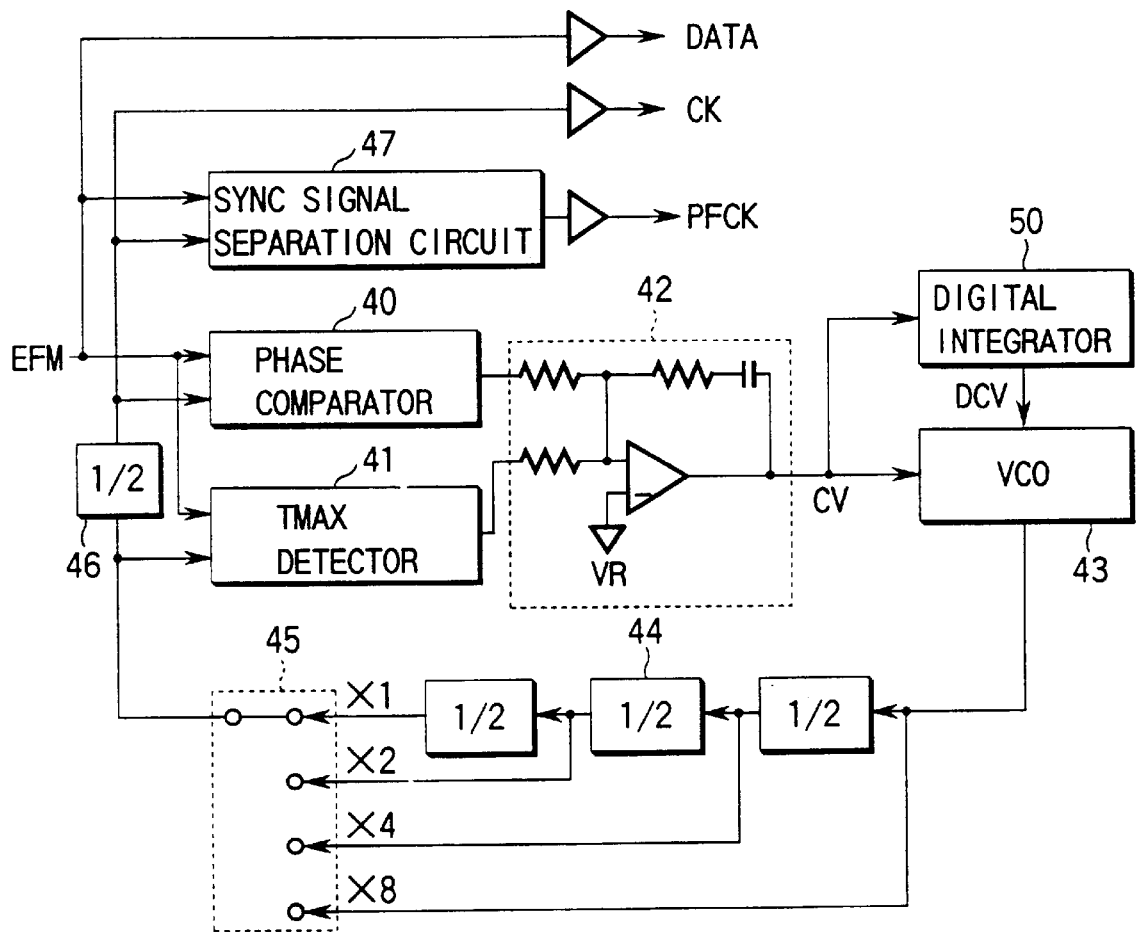
FIG. 4 is a diagram showing an active wide-range PLL device according to the present invention.
Figure 5:
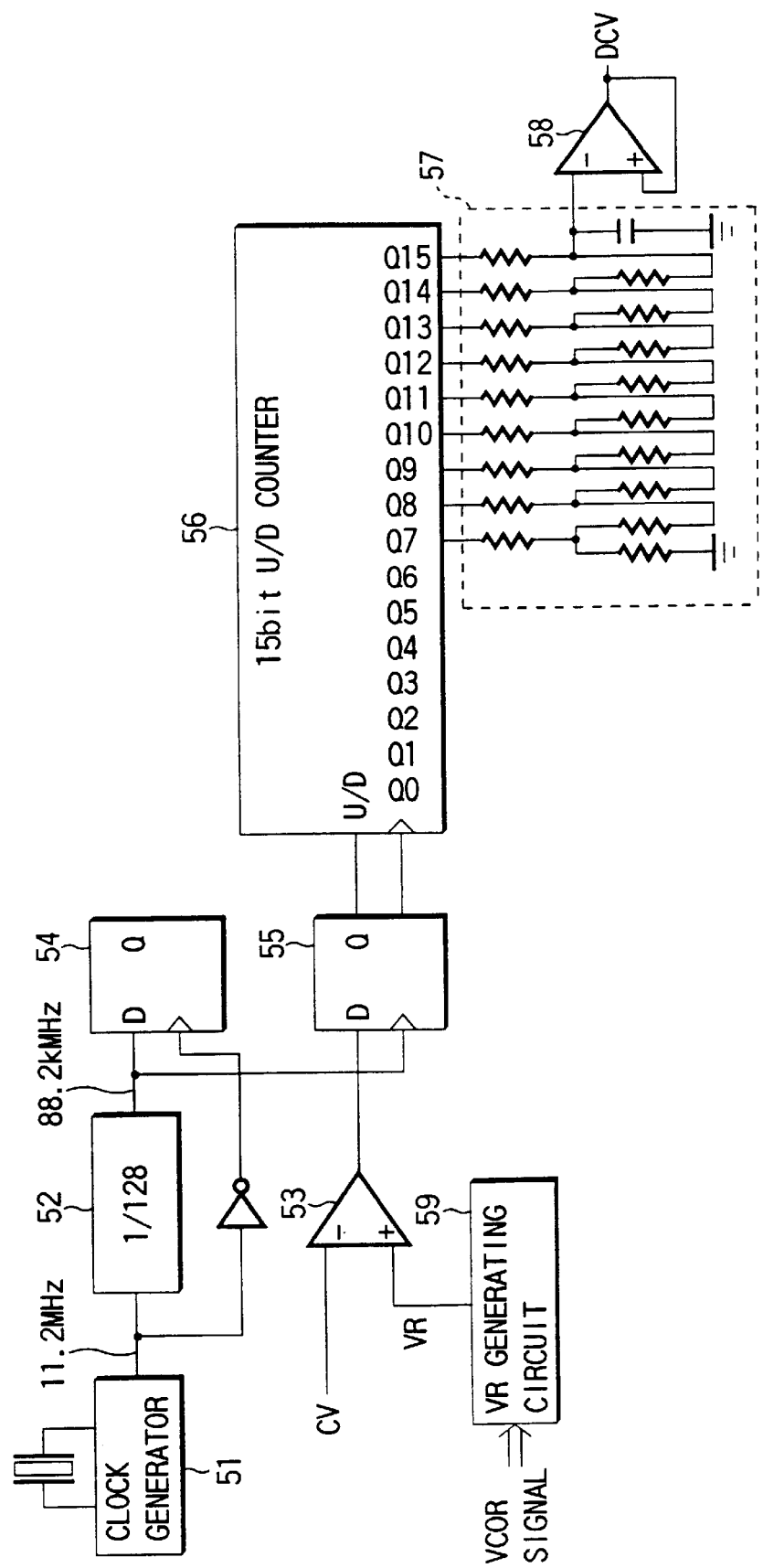
FIG. 5 is a diagram showing a digital integrator used in the PLL device in FIG. 4.
Figure 6:
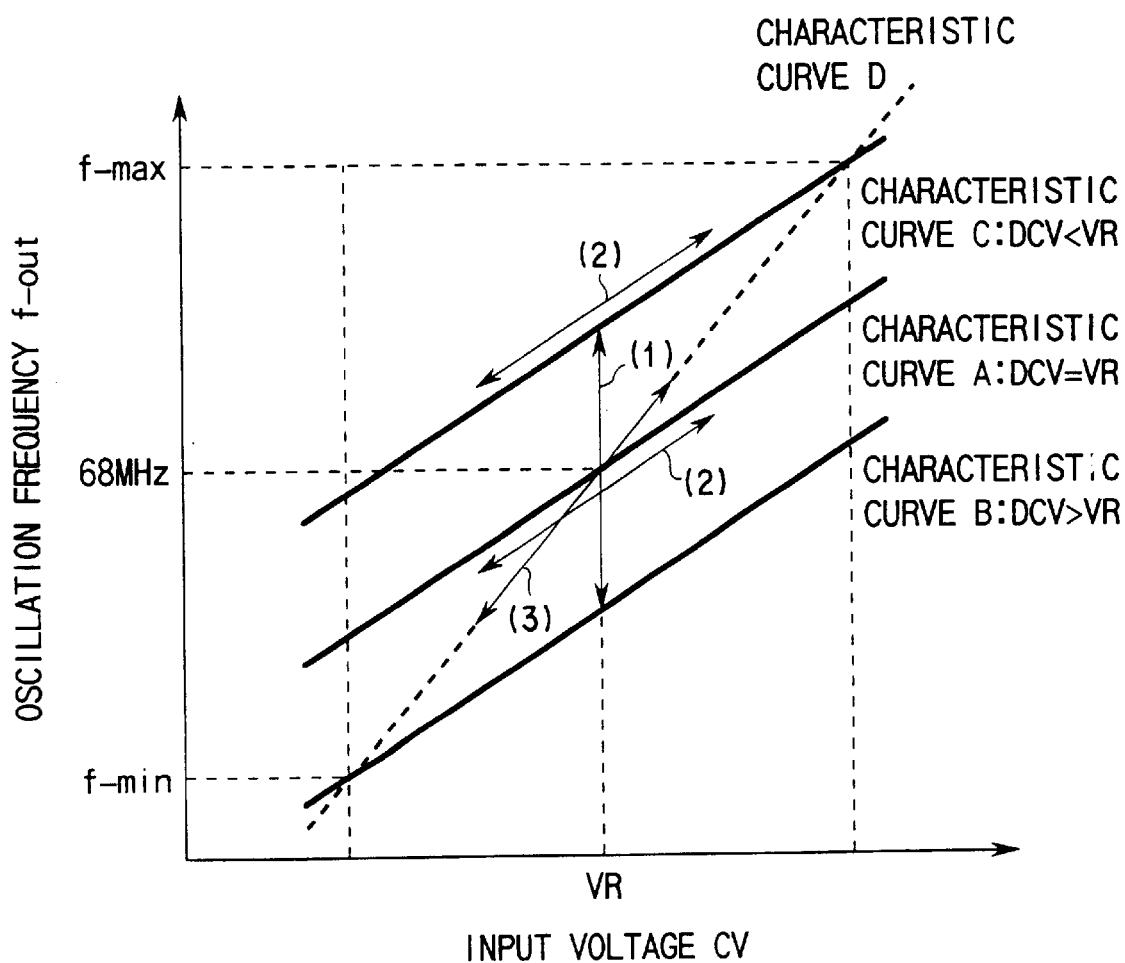
FIG. 6 is a graph showing oscillation frequency-input voltage characteristic curves to explain the VCO characteristics in the present invention.
Figures 7A, 7B, 7C:
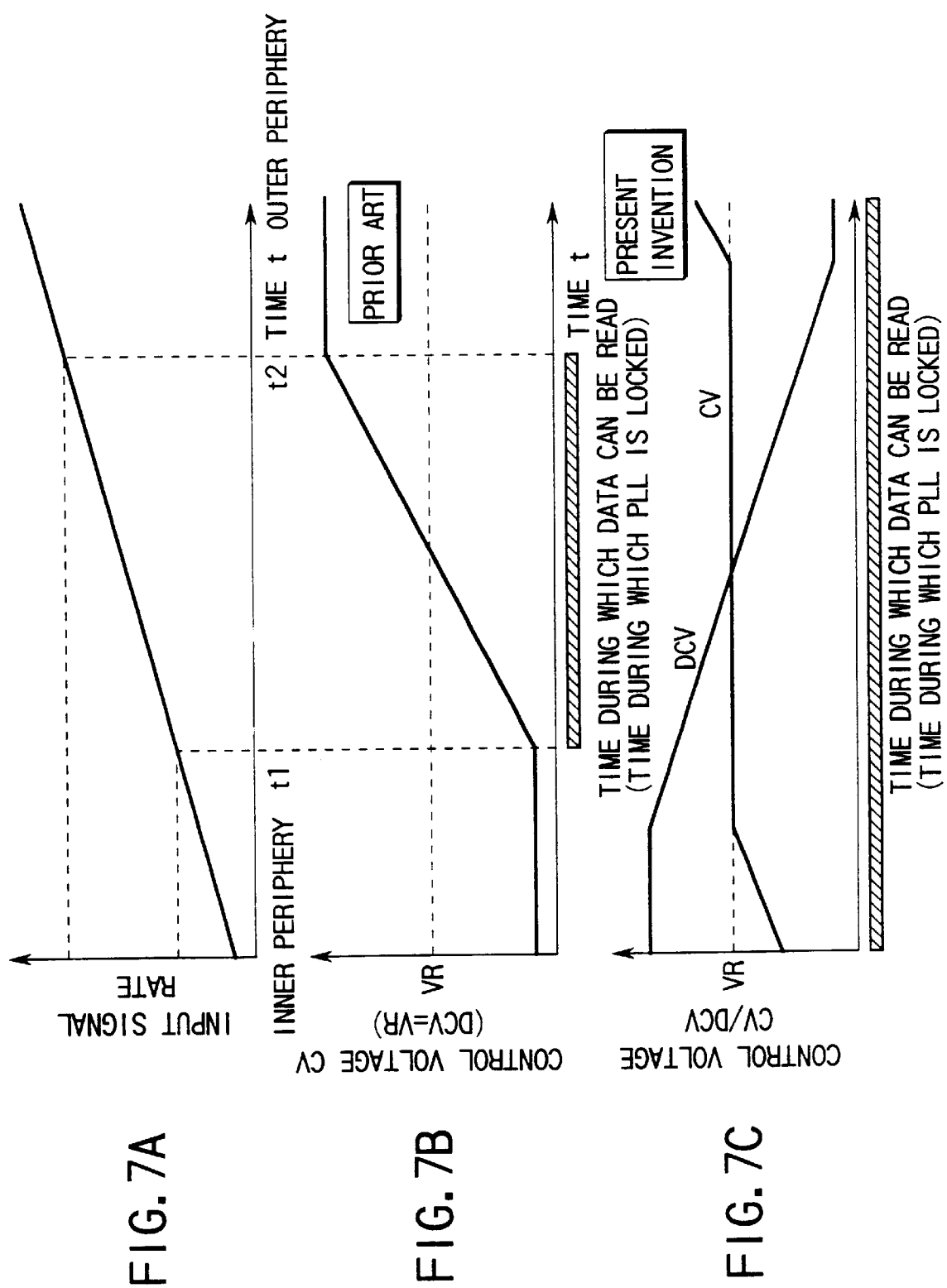
FIGS. 7A to 7C are graphs for comparing the operation of the PLL device of the present invention with the operation of a conventional PLL device.

FIG. 1 is a block diagram showing a CD-ROM driving system (disk reproducing apparatus) using an active wide-range PLL device according to the present invention. FIG. 4 is a diagram showing the active wide-range PLL device according to the present invention, which uses a digital integrator. FIG. 5 is a diagram showing the digital integrator in FIG. 4. FIG. 6 is a graph showing the VCO characteristics of the present invention. FIGS. 7A to 7C are graphs for comparing and explaining the operations of a conventional PLL device and the PLL device of the present invention. FIG. 2 is a circuit diagram showing a ring oscillator used in this active wide-range PLL device. FIG. 3 is an equivalent circuit diagram of a delay cell as a part of this ring oscillator.

The CD-ROM driving system will be described as an example with reference to FIG. 1.

A signal read by a pickup head 12 from a disk 11 which is being rotated by a disk motor 24 is input to an amplifier 13. The amplifier 13 generates an RF signal from this read signal. The RF signal is binarized into an EFM (Eight to Fourteen Modulation) signal by a date slice circuit 14. A binary signal EFM is input to a PLL/sync separation circuit 15, which generates a data signal DATA, a sync clock CK, and a sync signal PFCK. The data signal DATA and the sync clock CK generated by the PLL/sync separation circuit 15 are sent to an error correction circuit 16. Error correction is then performed in this error correction circuit 16 by using a buffer RAM 17. The signal corrected by the error correction circuit 16 is subjected to CD-ROM correction and buffering in a CD-ROM decoder circuit 18. Data exchange is then performed in accordance with an instruction from a host computer 28. When an audio disk is played, the data signal from the error correction circuit 16 is converted into an audio analog signal by an audio D/A converter 27, and output from the CD-ROM driving system.

As an operation clock for the error correction circuit 16, the sync clock CK extracted by the PLL/sync separation circuit 15 or a clock generated by a clock generator 25 is selected by a switch circuit 19. The switch circuit 19 is switched to select the sync clock CK to perform fast reproduction of CD-ROM data. In this case, variable speed reproduction is performed, as disclosed in U.S. application Ser. No. 08/288785 previously filed by the present inventors. The switch circuit 19 is switched to select the clock from the clock generator 25 to play the above audio disk.

A disk motor control circuit (CLV) 22 compares the sync signal PFCK extracted by the PLL/sync separation circuit 15 with a clock CLOCK generated by the clock generator 25, and generates a motor driving signal. This disk motor control circuit 22 is a circuit for rotating the disk motor at a constant linear velocity. This output (motor driving signal) is input to a motor driver 23 through a motor driver 23. The disk motor 24 is driven by the output from the motor driver 23.

A detector FG (Frequency Generator) 30 for detecting the number of revolutions of the disk motor 24 rotates the disk 11 under CAV (Constant Angular Velocity) control. CAV control is a necessary constituent element in consideration of CD-ROM driving. A signal representing the number of revolutions of the disk motor 24 and detected by the FG 30 is sent to a disk motor control circuit (CAV) 31, which measures the clocks from the clock generator 25 to generate a disk motor control signal. This signal is selected by the switch and sent to the motor driver 23.

A circuit for performing CAV control is not necessarily arranged in the conventional CD-ROM driving system. Considering a system including this circuit, a signal for switching the switch 32 may be controlled by the system controller.

Part of the signal output from the pickup head 12 is input to the switch circuit 19. The switch circuit 19 generates a pickup control error signal from the part of this signal. This error signal undergoes equalizing processing in a pickup servo circuit 20 and is input to a driving circuit 21, whose output drives a pickup actuator (not shown).

FIG. 4 is a diagram showing the detailed arrangement of the PLL/sync separation circuit 15 in FIG. 1. The sync signal PFCK input to the disk motor control circuit 22 in FIG. 1 is generated by a sync signal separation circuit 47. The data signal DATA and the sync clock CK input to the error correction circuit in FIG. 1 correspond to "DATA" and "CK" in FIG. 4, respectively. In general, a PLL (Phase Lock Loop) circuit includes a voltage-controlled oscillator (VCO) for generating an output signal, and a phase lock loop (PLL loop) for detecting the phase difference between a signal obtained by frequency-dividing this output to a predetermined frequency and a reference signal having a constant frequency, and applying a control voltage corresponding to the phase difference to the VCO. That is, the PLL loop adjusts the control voltage applied to the VCO such that a phase lock state is set, in which the signal obtained by frequency-dividing the output from the VCO is in phase with the reference signal. The PLL loop has a loop filter for converting the signal (current) corresponding to the phase difference into the control voltage. The EFM signal binarized by the date slice circuit 14 is input to a phase comparator 40, in which the phase of the EFM signal is compared with a clock obtained by frequency-dividing an output signal from a voltage-controlled oscillator (to be referred to as a VCO circuit hereinafter) 43. The EFM signal is input to a TMAX detector 41 for measuring the 11T-component signal (referred to as TMAX; since 1T=1/ n·4.3218 MHz (in n-fold speed reproduction), 11T=11/n 4.3218 MHz) contained in the sync signal in this signal by using the clocks output from the VCO circuit. The output signals from the phase comparator 40 and the TMAX detector 41 are added/integrated by a lag/lead filter 42. The resultant signal is input to the VCO circuit 43. The output clock from the VCO circuit 43 is frequency-divided and selected by a frequency divider 44 and input to the phase comparator 40 and the TMAX detector 41. In the present invention, the DCV terminal for generating the DCV signal is connected to a digital integrator 50, in addition to the CV terminal for determining the oscillation characteristics of the VCO circuit 43, and this DCV signal is supplied to the VCO circuit 43. With this arrangement, the reference voltage for the VCO circuit 43 is dynamically adjusted.

In the CD-ROM driving system in FIG. 1, the EFM signal binarized by the date slice circuit 14 is input to the phase comparator 40, which compares the phase of the EFM signal with that of the clock obtained by frequency-dividing the output signal from the VCO circuit 43. The EFM signal is also input to the TMAX detector 41 to measure the 11T-component signal TMAX contained in the sync signal in this signal by using the clocks output from the VCO circuit. The output signals from the phase comparator 40 and the TMAX detector 41 are added/integrated by the lag/lead filter 42. The resultant signal is input to the VCO circuit 43. The output clock from the VCO circuit 43 is frequency-divided and selected by the frequency divider 44 and input to the phase comparator 40 and the TMAX detector 41.

In this case, when an input signal CV to the VCO circuit 43 has a reference voltage (VR), the output clock has a frequency of 68 MHz. Since the sync clock of the EFM signal has a frequency of 4.32 MHz in single speed reproduction, the frequency is 1/16 that of the output clock from the VCO circuit 43. In this case, the clock input to the TMAX detector 41 has a frequency twice that of the clock input to the phase comparator 40. This relationship remains the same from single speed reproduction to octuple speed reproduction. In double speed reproduction, the clock input to the phase comparator 40 has a frequency of 8.64 MHz, which is twice that of the clock in single speed reproduction. In quadruple speed reproduction and octuple speed reproduction, the input clocks respectively have frequencies of 17.28 MHz and 34.56 MHz.

FIG. 2 shows a ring oscillator type VCO circuit using a delay line, which is generally used in a CMOS LSI. This circuit is characterized in that the gate voltage of the P-channel MOS transistor (P-ch) changes depending on the DCV terminal. In addition, by changing the gate voltage of the N-channel MOS transistor (N-ch), the equivalent ON resistance of this pair of transistors is changed to change the oscillation frequency (f-out) of a ring oscillator 60. The ring oscillator 60 has a plurality of pairs of P-channel/N-channel transistors whose sources and drains are connected to each other, and inverters inserted between the respective pairs. FIG. 3 is an equivalent circuit diagram of the delay cell of the ring oscillator 60 which is used in the VCO circuit in FIG. 2. Changing the ON resistance of the MOS resistor is equivalent to changing the variable resistor in FIG. 3.

In the VCO circuit having the ring oscillator 60 in FIG. 2, the DCV terminal is fixed to the reference voltage VR. In the present invention, as shown in FIG. 4, the DCV terminal is connected to the output terminal of the digital integrator 50. The operation of the active wide-range PLL device having the above arrangement will be described below.

The characteristics of the ring oscillator type VCO shown in FIG. 2 will be described first. FIG. 6 is a graph showing the characteristics of this VCO.

When the DCV terminal is set to the reference voltage VR, the characteristics represented by a characteristic curve A are obtained. In the prior art, when the input signal CV is at the VR level, the oscillation output has a frequency of 68 MHz. While the disk normally rotates under CLV control as in the prior art, the PLL loop operates around the 68-MHz point on the characteristic curve A. When the DCV terminal is set to a voltage higher than the reference voltage VR, the gate voltage of the P-ch transistor in FIG. 2 becomes higher than a reference level (the point corresponding to DCV= VR). For this reason, the equivalent resistance of the P-ch transistor increases to decrease the oscillation frequency. When the voltage of the DCV terminal is lowered below the reference voltage VR, the equivalent resistance of the P-ch transistor decreases. As a result, the oscillation frequency increases.

In this digital integrator 50, since the CV voltage is integrated with respect to the reference potential, the DCV voltage is determined such that the CV voltage becomes equal to the VR voltage. At this time, a required VCO oscillation frequency is selected.

The high-frequency operation that determines a PLL band is determined by an operating point on "(1)" in FIG. 6, and oscillation occurs on an operating point on "(2)" in accordance with the data rate at which data is reproduced from the disk.

A characteristic curve D represents a case in which the oscillation range of the VCO circuit is expanded on the basis of the conventional idea. If such characteristics are realized, data can be read at high speed even if the CLV disk is rotated at CAV. However, as described above, since the response speed of data in the high-frequency region in the PLL circuit also increases, the error rate or the like increases.

As described above, the DCV voltage is determined such that the CV voltage becomes equal to the VR voltage. According to the frequency-input voltage characteristics shown in FIG. 6, the characteristic curves freely change in the vertical direction. For this reason, this circuit operates as if a VCO circuit having a very wide variable oscillation width were realized.

The digital integrator 50 in FIG. 1 will be described next. FIG. 5 is a block diagram showing an example of the arrangement of a digital integrator A comparator 53 compares the output CV from the lag/lead filter 42 with the reference voltage VR determined by the VCOR signal. The VCOR signal is input to a VR generating circuit 59 to generate the reference voltage VR. For example, the VCOR signal consists of a digital value consisting of several bits. The VR generating circuit 59 is constituted by a D/A converter corresponding to this digital value, and the like.

The VR potential generated by this VR generating circuit is the VR voltage shown in FIG. 6, but need not always be the center value of the power supply voltage (the center value in the dynamic range). This potential may be a predetermined voltage that changes occasionally. For example, the voltage on which the VCOR signal is based may a voltage depending on information obtained by counting the PFCK signal with system clocks in the CAV reproduction mode. This information is the rotation information on a disk, as described in U.S. application Ser. No.: 08/288785 filed by the present inventors. From a different point of view, this information represents the data rate of an information signal. The position information on the pickup in the radial direction of the disk can be obtained from this information. In either the CAV control mode or the CLV control mode, when the pickup is located on the inner periphery of the disk, the pickup moves to the outer periphery in many cases. The data rate tends to increase (change in the direction in which the oscillation frequency of the VCO circuit increases). Therefore, this VR potential is set to be relatively low to expand the dynamic range on the side on which the oscillation frequency is high. When the pickup is located near the outer periphery of the disk, the VR voltage is set to be relatively high contrary to the above reason. Under the circumstances, the VR voltage indicates a predetermined voltage in the following description.

A frequency divider 52 frequency-divides a 11.2 MHz clock generated by a cock generator 51 by 128 to generate an 88.2-kHz clock. This clock is input to a D-type FF 55 to shift the output form the comparator 53. With this operation, whether the integral value is increased or decreased is determined at 88.2 -kHz periods. The output terminal of the D-type FF 55 is connected to the input terminal (U/D) of the up/down counter 56 which receives a signal for switching between a count-up operation and a down-count operation. The counting operation of the up/down counter 56 is performed by using a clock whose timing is adjusted by causing a D-type FF 54 to shift the 88.2-kHz clock using the inverted signal of the 11.2-MHz clock. Only the upper 8 bits of the output from the up/down counter 56 which are used to adjust the gain of the integrator are input to an R-2R digital/analog converter (DAC) 57. As a result, the digital value is converted into an analog value. The impedance of the resultant output is decreased by an operational amplifier 58. The resultant output is input to the DCV terminal of the VCO circuit 43. This integrator is of an inverting amplification type, and its DC gain is infinite.

The active wide-range PLL device having the above arrangement is an effective means having a CMOS-LSI incorporated in a substrate. In addition, since this device includes a digital circuit, it is stable in terms of function and performance and easy to use.

According to the present invention, since the oscillation frequency satisfactorily changes while the same performance as that in the prior art is maintained in terms of the error rate and the like of a disk even when the disk on which data is recorded at CLV is rotated at CAV, the data can be read at very high speed.

FIGS. 7A to 7C are graphs for explaining the evaluation of the active wide-range PLL device of the present invention. FIG. 7A is a graph showing the operation of the active wide-range PLL device in terms of changes in data rate with time. FIG. 7A shows changes in data rate with time when, for example, a disk on which data is recorded at CLV is rotated at CAV, and the pickup is moved from the inner periphery to the outer periphery.

FIG. 7B shows a case in which DCV=VR is set as in the conventional PLL device, and more specifically, a case in which the characteristics of the VCO circuit correspond to the characteristic curve A in FIG. 6. According to the characteristics, since the variable oscillation width of the VCO circuit does not completely cover changes in data rate, the PLL cannot be locked in a region where the VCO circuit does not follow the data rates at the inner and outer peripheries. For this reason, no data can be read (in the region indicated by the hatching in FIG. 7B, the PLL can be locked).

FIG. 7C shows the case of the active wide-range PLL device of the present invention. As is apparent, the DCV voltage changes such that the CV voltage becomes equal to the VR voltage. In this case, the DCV voltage changes to the region where the VSS voltage exceeds the VDD voltage. At this time, however, the CV voltage changes to change the oscillation frequency to the target oscillation frequency. According to the active wide-range PLL device of the present invention, the VCO circuit can oscillate clocks required at all positions on the inner and outer peripheries, thereby allowing a data read operation.

Figure 8:
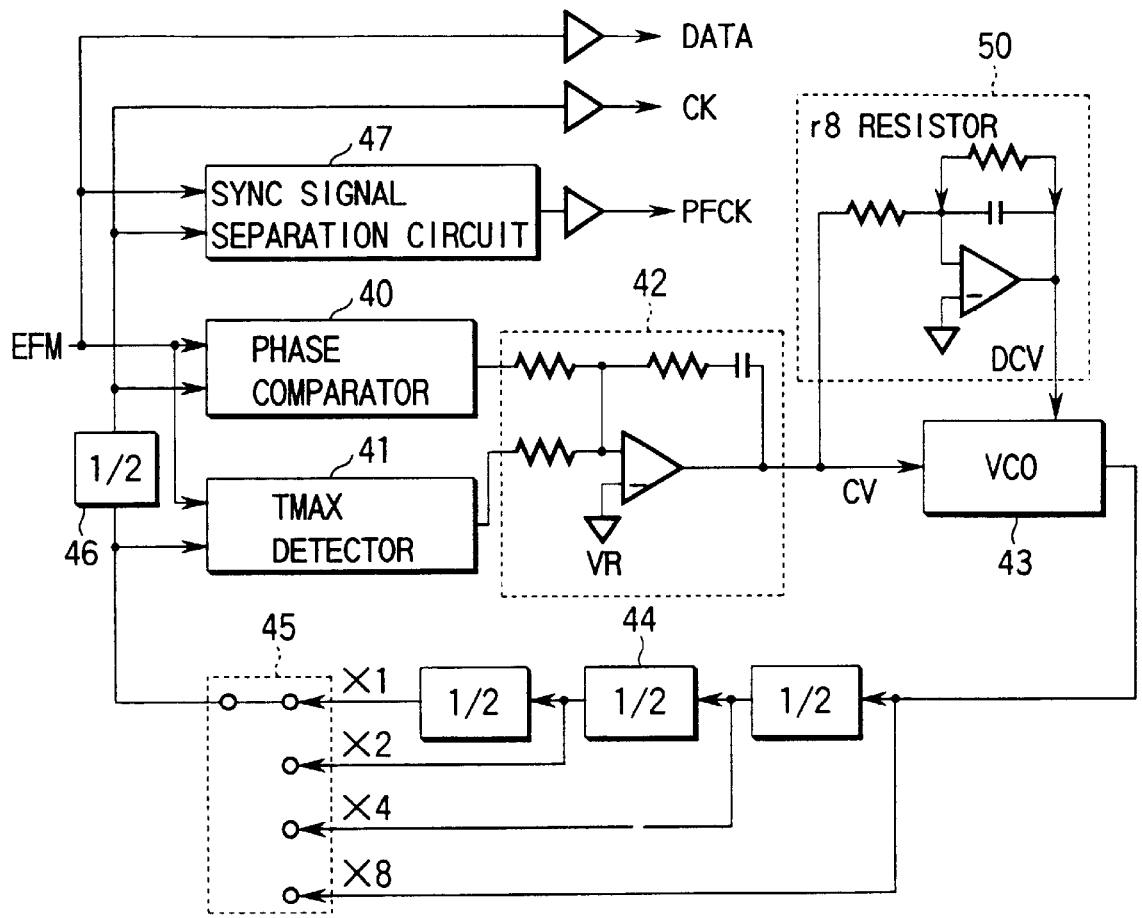
FIG. 8 is a diagram showing an active wide-range PLL device according to the present invention.

FIG. 8 is a diagram showing an active wide-range PLL device according to the second embodiment of the present invention, and more specifically, a diagram showing the detailed arrangement of the PLL/sync separation circuit 15 in FIG. 1. The structure and operation of the circuit in FIG. 1 have been described above. FIG. 8 shows an active wide-range PLL device using an analog integrator in place of the digital integrator shown in FIG. 4. This circuit scheme is very easy to form. In consideration of the incorporation of the circuit into an actual LSI, however, difficulties are posed in performing analog offset control on the amplifier and guaranteeing its performance. In addition, the reference potential applied to the inverting input terminal of the operational amplifier used in an digital integrator 50 may be generated by a variable VR generating circuit like the one shown in FIG. 5. A resistor r8 can be connected to the operational amplifier of the digital integrator 50 in FIG. 8. If, however, this resistor r8 is connected to the operational amplifier, the response indicated by "(2)" changes to the response indicated by "(3)" in only the low-frequency region in the response characteristics of the PLL circuit which are shown in FIG. 6.

Figure 9:
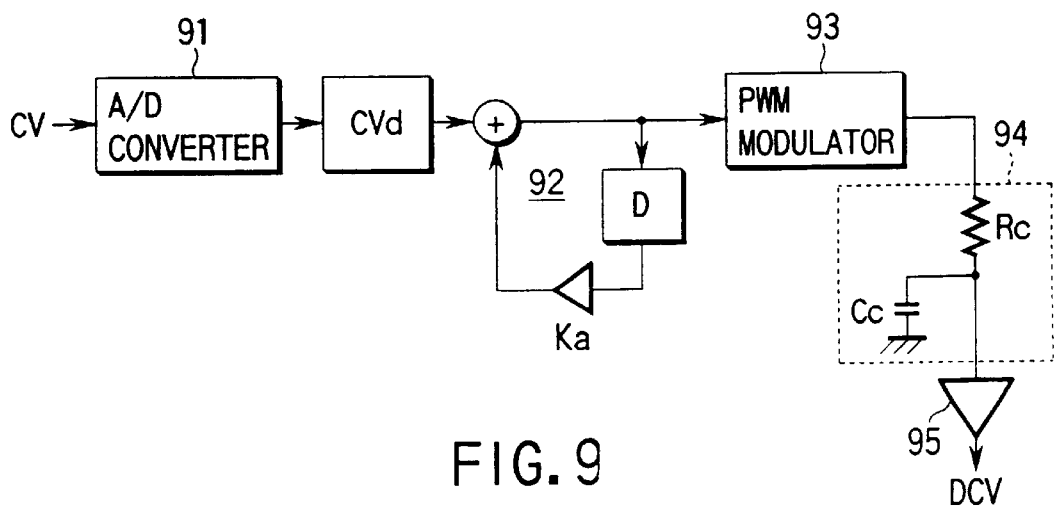
FIG. 9 is a diagram showing another arrangement of the digital integrator in FIG. 4 according to the present invention.

FIG. 9 is a diagram showing a circuit used in an active wide-range PLL device according to the third embodiment of the present invention, and more specifically, a diagram showing an arrangement different from that (shown in FIG. 5) of the digital integrator 50 in FIG. 4. A voltage CV is converted into a digital signal by an A/D converter 91 to become digital data CVd. This digital data is input to an IIR type digital integrator 92. Referring to FIG. 9, reference numeral D denotes a register for realizing a 1-sample delay operation; and Ka, a coefficient for determining an integral time constant. This integration result signal is pulse-width-modulated by a PWM modulator 93. A low-pass filter 94 constituted by a resistor Rc and a capacitor Cc removes a carrier from the modulated signal. Thereafter, the signal is input to a buffer amplifier 95 to generate the DCV voltage. Such a circuit arrangement can be entirely prepared in the circuit arrangement incorporated in the digital signal processor, any new circuit need not be designed and added. This circuit can therefore be easily formed.

As has been described above, by adding an integrating circuit is added for control on the VCO of the PLL/sync separation circuit 15, a high-performance PLL circuit can be formed without sacrificing the error rate and the like even if the data rate greatly changes as in the case in which a CLV disk on which data is recorded is rotated under CVA control. With the application of the present invention, a system with a very high utility value can be formed for a future driving system designed to operate in both the CAV mode and the CLV mode.

With the use of the active wide-range PLL device of the present invention, a high-performance CD-ROM driving system can be formed, in which a wide change width of oscillation frequencies can be ensured while the performance of the high-frequency portion that determines the error rate and the like is kept in the same manner as that in the prior art. In addition, the present invention can be applied to a DVD and the like which are basically designed to perform CLV recording.

As is apparent, according to the present invention, parts to be added can be incorporated in an LSI, and a high-performance PLL circuit can be realized with almost no increase in cost. If data can be read by rotating a disk at a constant angular velocity (CAV), the motor used to rotate the disk need not have a very large capacity. In addition, since rotation variations need not be corrected, the seek time can be shortened. The necessity of CAV control increases as the reproduction speed increases. According to the present invention, therefore, a reproducing apparatus can be used, which performs not only CAV control but also CLV control such that CLV control is performed for, for example, the reproduction speed equal to or lower than the octuple speed, but CAV control is performed for the reproduction speed higher than the octuple speed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A disk reproducing apparatus comprising:
a reading mechanism configured to read data from a disk on which the data is recorded; and
a PLL circuit having a voltage-controlled oscillator to be operated by a first control voltage and a second control voltage, the first control voltage being used to continuously change an oscillation frequency of the voltage-controlled oscillator, and the second control voltage being used to continuously change a characteristic curve showing a relation between the first control voltage and the oscillation frequency,
wherein the first and second control voltages change in accordance with a data rate which is changed by a CAV operation or a variable speed reproduction or a seek mode, and a center frequency of the characteristic curve is changed in an analog manner by the second control voltage.

2. A disk reproducing apparatus according to claim 1, further comprising:
a disk motor control circuit which rotates the disk and changes the rotational speed of the disk.

3. A disk reproducing apparatus according to claim 1, further comprising:
a memory for storing a binarized data generated in accordance with the data read from the disk; and
an error correction circuit for performing an error correction processing of the binarized data, the error correction circuit having applied thereto a clock output from the PLL circuit.

4. A disk reproducing apparatus according to claim 1, wherein the PLL circuit comprises:
a first control voltage generator for generating the first control voltage, comprising
a phase comparator which compares phases of a binarized data and a clock having the oscillation frequency, and
a frequency detector which detects data having a predetermined frequency from the binary data.

5. A disk reproducing apparatus according to claim 1, wherein the center frequency changes coincidently with the oscillation frequency.

6. A disk reproducing apparatus according to claim 1, wherein when the oscillation frequency of the voltage-controlled oscillator is changed, the center frequency is changed to be closer to the oscillation frequency.

7. A disk reproducing apparatus according to claim 1, wherein when the oscillation frequency of the voltage-controlled oscillator is changed, the center frequency is changed so that a difference between the center frequency and the oscillation frequency is lessened.

8. A disk reproducing apparatus according to claim 1, wherein said second control voltage is an analog signal into which the digital signal is converted.

* * * * *